United States Patent
Chen et al.

(10) Patent No.: US 8,946,795 B2
(45) Date of Patent: Feb. 3, 2015

(54) BACKSIDE-ILLUMINATED (BSI) IMAGE SENSOR WITH REDUCED BLOOMING AND ELECTRICAL SHUTTER

(75) Inventors: Gang Chen, San Jose, CA (US); Sing-Chung Hu, San Jose, CA (US); Duli Mao, Sunnyvale, CA (US); Hsin-Chih Tai, San Jose, CA (US); Yin Qian, Milpitas, CA (US); Vincent Venezia, Los Gatos, CA (US); Rongsheng Yang, Palo Alto, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 135 days.

(21) Appl. No.: 13/050,285

(22) Filed: Mar. 17, 2011

(65) Prior Publication Data
US 2012/0235212 A1 Sep. 20, 2012

(51) Int. Cl.
*H01L 31/113* (2006.01)
*H01L 27/146* (2006.01)

(52) U.S. Cl.
CPC .... *H01L 27/14656* (2013.01); *H01L 27/14603* (2013.01); *H01L 27/14689* (2013.01)
USPC 257/292; 257/53; 257/E31.078; 257/E31.084; 438/60; 438/75

(58) Field of Classification Search
USPC ............ 257/53, 215, 225, 292, E31.078, 257/E31.084; 438/60, 75
See application file for complete search history.

(56) References Cited

U.S. PATENT DOCUMENTS

| | | | |
|---|---|---|---|
| 4,696,021 A * | 9/1987 | Kawahara et al. .............. 377/58 |
| 7,271,835 B2 * | 9/2007 | Iizuka et al. ................... 348/314 |
| 2004/0169127 A1 * | 9/2004 | Ohkawa ..................... 250/214.1 |
| 2006/0180745 A1 * | 8/2006 | Lee ............................. 250/214.1 |
| 2007/0012966 A1 * | 1/2007 | Park ............................. 257/291 |
| 2008/0283726 A1 * | 11/2008 | Uya et al. .................. 250/208.1 |
| 2010/0165167 A1 * | 7/2010 | Sugiyama et al. ............ 348/311 |
| 2010/0321518 A1 * | 12/2010 | Shinohara ................. 348/222.1 |
| 2011/0139962 A1 * | 6/2011 | Masaaki .................... 250/208.1 |

* cited by examiner

*Primary Examiner* — Su Kim
(74) *Attorney, Agent, or Firm* — Blakely Sokoloff Taylor & Zafman LLP

(57) ABSTRACT

Embodiments of a pixel including a photosensitive region formed in a surface of a substrate and an overflow drain formed in the surface of the substrate at a distance from the photosensitive area, an electrical bias of the overflow drain being variable and controllable. Embodiments of a pixel including a photosensitive region formed in a surface of a substrate, a source-follower transistor coupled to the photosensitive region, the source-follower transistor including a drain, and a doped bridge coupling the photosensitive region to the drain of the source-follower transistor.

6 Claims, 6 Drawing Sheets

US 8,946,795 B2

BACKSIDE-ILLUMINATED (BSI) IMAGE SENSOR WITH REDUCED BLOOMING AND ELECTRICAL SHUTTER

TECHNICAL FIELD

The present invention relates generally to image sensors and in particular, but not exclusively, to backside-illuminated image sensors with reduced blooming and/or electrical shutter.

BACKGROUND

A typical image sensor includes various optical and electronic elements formed on a front side of the sensor. The optical elements include at least an array of individual pixels to capture light incident on the image sensor, while the electronic elements include transistors. Although the optical and electronic elements are formed on the front side, an image sensor can be operated as a frontside-illuminated (FSI) image sensor or a backside-illuminated (BSI) image sensor. In an FSI image sensor, light to be captured by the pixels in the pixel array is incident on the front side of the sensor, while in a BSI image sensor the light to be captured is incident on the back side of the sensor.

Compared to FSI image sensors, BSI image sensors drastically improve fill factor, quantum efficiency and cross talk, hence improving the sensor's overall optical performance. BSI technology also makes it possible to continuously scale CMOS pixel size down to sub-0.11 microns. However, unlike FSI, BSI blooming issues have not been satisfactorily solved due to three major obstacles. First, BSI sensors intrinsically have no highly-doped bulk region to recombine extra photoelectrons. Next, BSI outperforms FSI for pixel sizes of 1.75 micron and below, but unlike FSI there is no room to add anti-blooming features into the already very small pixel cells. Finally, BSI image sensors collect photons from the back side, but the silicon substrate in a BSI sensor is only about 2 microns thick, there is no room vertically to design vertical overflow drains between the back side and the photodetector to capture the extra photoelectrons.

BRIEF DESCRIPTION OF THE DRAWINGS

The specification that follows describes non-limiting and non-exhaustive embodiments of the present invention with reference to the following figures, wherein like reference numerals refer to like parts throughout the various views unless otherwise specified. Drawings are not to scale unless specifically indicated.

DETAILED DESCRIPTION OF THE ILLUSTRATED EMBODIMENTS

Embodiments of an apparatus, process and system for backside-illuminated image sensors with reduced blooming and/or electrical shutter are described. Numerous specific details are described to provide a thorough understanding of embodiments of the invention, but one skilled in the relevant art will recognize that the invention can be practiced without one or more of the specific details, or with other methods, components, materials, etc. In some instances, well-known structures, materials, or operations are not shown or described in detail but are nonetheless encompassed within the scope of the invention.

Reference throughout this specification to "one embodiment" or "an embodiment" means that a particular feature, structure, or characteristic described in connection with the embodiment is included in at least one described embodiment. Thus, appearances of the phrases "in one embodiment" or "in an embodiment" do not necessarily all refer to the same embodiment. Furthermore, the particular features, structures, or characteristics may be combined in any suitable manner in one or more embodiments.

Figure 1:
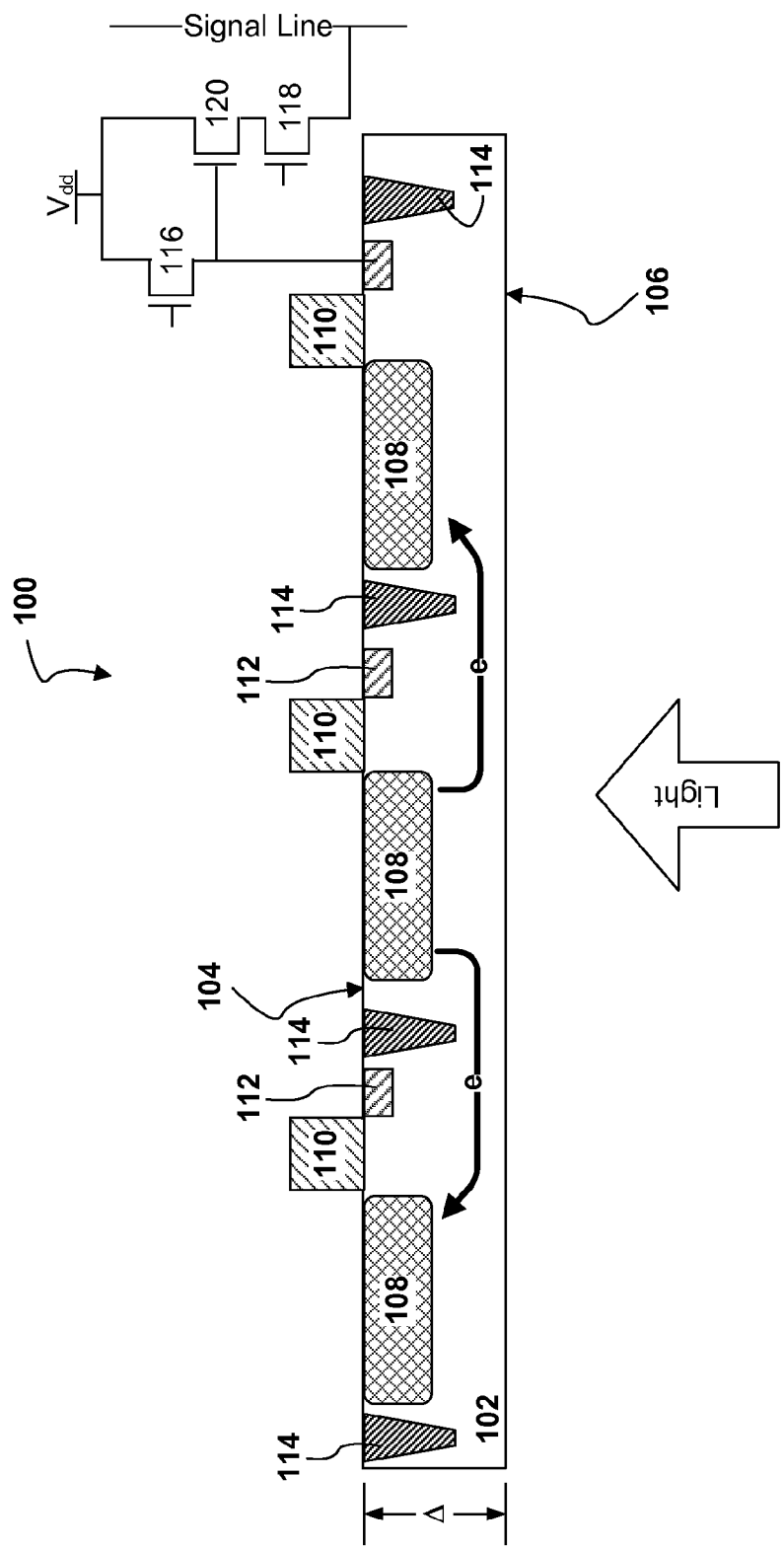
FIG. 1 is a cross-sectional drawing of a portion of an embodiment of a backside-illuminated (BSI) image sensor.

FIG. 1 illustrates an embodiment of a portion of a backside-illuminated image sensor 100. The illustrated portion of image sensor 100 includes three pixels formed in a substrate 102 that has a front surface 104, a back surface 106, and a thickness A between the front surface and the back surface. The pixels are formed in, on, or near front surface 104. Each pixel includes a photosensitive area 108, a floating node 112, and a transfer gate 110 that, when switched on, transfers charge accumulated in photodetector 108 to the floating node. Shallow trench isolations (STIs) 114 can be used to physically separate and electrically isolate each individual pixel from its adjacent pixels in a pixel array.

During an integration period (also referred to as an exposure period or accumulation period) photosensitive regions 108 receive incident light through the back surface, as shown by the arrow, and generate charge in the depletion volume of photosensitive region 108. After the charge is generated it is held as free electrons in photosensitive region 108. At the end of the integration period, the electrons held in photosensitive region 108 (i.e., the signal) are transferred into floating node 112 by applying a voltage pulse to turn on transfer gate 110. When the signal has been transferred to floating node 112, transfer gate 110 is turned off again for the start of another integration period. After the signal has been transferred from photosensitive region 108 to floating node 112, the signal held in each floating node is used to modulate an amplification transistor 120, which is also known as a source-follower transistor. An address transistor 118 is used to address the pixel and to selectively read out the signal onto the signal line. Finally, after readout through the signal line, a reset transistor 116 resets floating node 112 and photosensitive region 108 to a reference voltage, which in one embodiment is $V_{dd}$.

In a pixel that is subjected to a very high amount of light during the exposure period—because it happens to correspond to a very bright part of the image, for example— photosensitive region 108 quickly becomes "full" of charge carriers (e.g., electrons). When the photosensitive region becomes full, charge carriers have nowhere to go and begin to migrate out of photosensitive region 108 and toward the photosensitive regions of neighboring pixels, as shown by the arrows labeled "e" in the figure. This migration of charge carriers from one pixel to adjacent pixels is known as blooming. Blooming distorts the signals from adjacent pixels: in the resulting image the brightest spot expands to a relatively dark area and makes the picture inaccurate. STIs 114 are formed in substrate 102 to attempt to block this migration of charge carriers, but the STIs are not completely effective and their effectiveness in BSI image sensors is lower than in FSI image sensors.

Figure 2A:
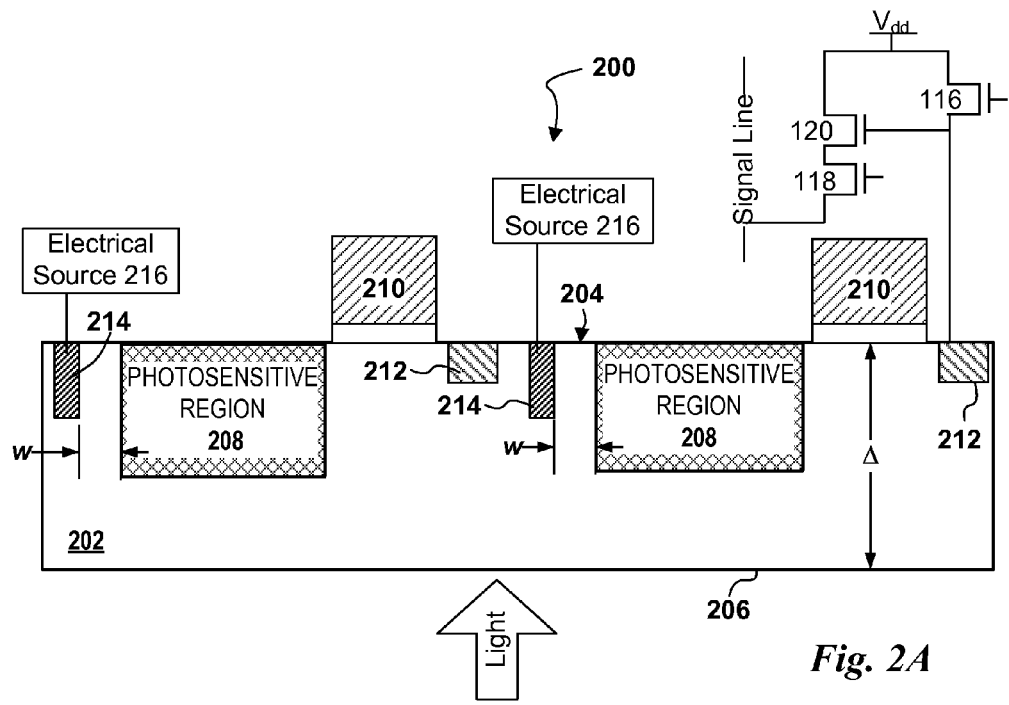
FIG. 2A is a cross-sectional drawing of a portion of an embodiment of a BSI image including pixels with overflow drains.

FIG. 2A illustrates a portion an embodiment of a BSI image sensor 200. The illustrated portion includes two pixels formed in a substrate 202 that has a front surface 204, a back surface 206, and a thickness Δ between the front surface and the back surface. In one embodiment, substrate 202 is an epitaxial (epi) layer of silicon, but in other embodiments other types of substrates, such as amorphous silicon or single crystal silicon, can be used. The pixels are formed in, on, or near front surface 204, and each pixel includes a photosensitive region 208, a floating node 212, and a transfer gate 210 that can be used to selectively transfer accumulated charge from photosensitive region 208 to the floating node. In the illustrated embodiment, photosensitive region 208 can be an N-type region and substrate 202 can be a P-type region, making photosensitive region 208 a p-n-p photodetector. In other embodiments the charge types (e.g., positive or negative charge carriers) of these elements can be reversed—that is, in other embodiments photosensitive region 208 can be P-type and layer 202 can be N-type, forming an n-p-n photodetector.

Each pixel also includes an overflow drain 214 formed in, on, or near front surface 204 and positioned adjacent to photosensitive region 208. Overflow drain 214 is positioned at a distance w from photosensitive region 208. In one embodiment distance w can be between 0.05 and 0.4 microns, but in other embodiments distance w can be between 0.1 microns and 0.3 microns. In still other embodiments, distance w can be higher or lower than the mentioned ranges.

In one embodiment, overflow drain 214 can be an n+ doped region, but in other embodiments other doping types (n-, for instance) can be used. In one embodiment, overflow drain 214 is grounded (i.e., zero electrical bias), but in other embodiments overflow drain 214 can be coupled to an electrical source 216 that can control the overflow drain's electrical bias. Electrical source 216 can be variable and controllable so that the electrical bias, if any, of overflow drain 214 can be controlled; by controlling the electrical bias, the amount of charge carriers drawn from photosensitive region 208 into overflow drain 214 can be controlled.

In one embodiment electrical source 216 can be a voltage control node that outputs a variable and controllable voltage to overflow drain 214, but in other embodiments other electrical sources can be used. In an embodiment that uses a voltage control node, the voltage control node can apply a voltage greater than 0.01 volts to the overflow drain to draw away a portion of the charge carriers.

When overflow drains are added to the pixels, and the photosensitive regions become "full" the excess photo electrons flow into the n+ drains that are grounded or slightly positive biased. The anti-blooming performance can be controlled to various levels, by adjusting the overflow drain bias potential: higher potential makes the anti blooming performance more effective but full well capacity might be affected negatively. Blooming between neighboring photosensitive regions can be significantly reduced without sacrificing other pixel performance by adding an n+ overflow drain at the front side of the silicon.

In one embodiment, if the voltage applied to overflow drains 214 is increased to a certain level, the full well capacity will tend to decrease to zero, thus achieving electrical shuttering. In one embodiment, a voltage control node can be used to apply a voltage exceeding about 3.3 volts, causing overflow drains 214 to draw away a large portion of the charge carriers, up to and including all the charge carriers, so that overflow drain 214 effectively functions as an electric shutter. So the traditional expensive mechanical shutters are replaced by more cost-effective electrical shutters. By doing this, mobile phone cameras, PC cameras, security and many other appliances can have shutters, which are currently only available through mechanical approaches in high end cameras.

Figure 2B:
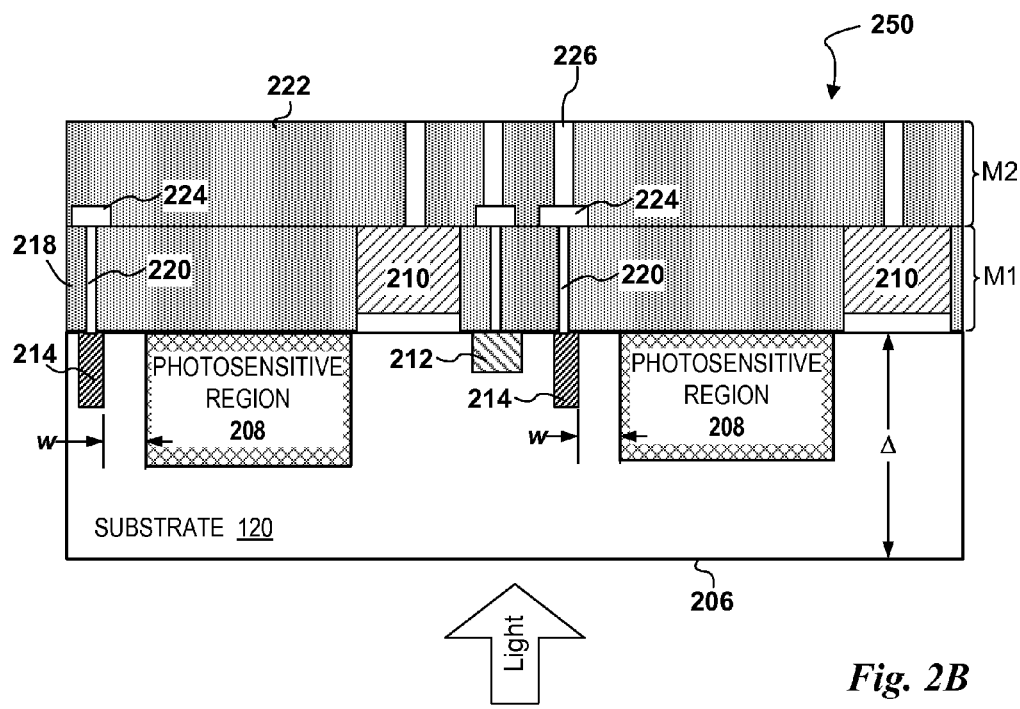
FIG. 2B is a cross-sectional drawing of a portion of an embodiment of a BSI image sensor including pixels with overflow drains and having front side metal stacks.

FIG. 2B illustrates a portion of an alternative embodiment of a BSI image sensor 250. The illustrated portion of image sensor 250 is in most respects similar to the illustrated portion of image sensor 200 shown in FIG. 2A. The primary difference between image sensors 200 and 250 is the addition in image sensor 250 of metal stacks M1 and M2. M1 and M2 are called metal stacks because, among other things, they provide electrically conductive paths—usually metal, but not necessarily—for the elements formed in substrate 202. Metal stack M1 includes a dielectric material 218 in which are formed various conductive vias 220. Metal stack M2 includes a dielectric material 222, as well as electrically conductive traces 224 and vias 226. Vias 220 electrically couple overflow drains 214 to traces 224 and/or vias 226, thereby providing a path through which drains 214 can be grounded or provided with a non-zero electrical bias.

Figure 3A:
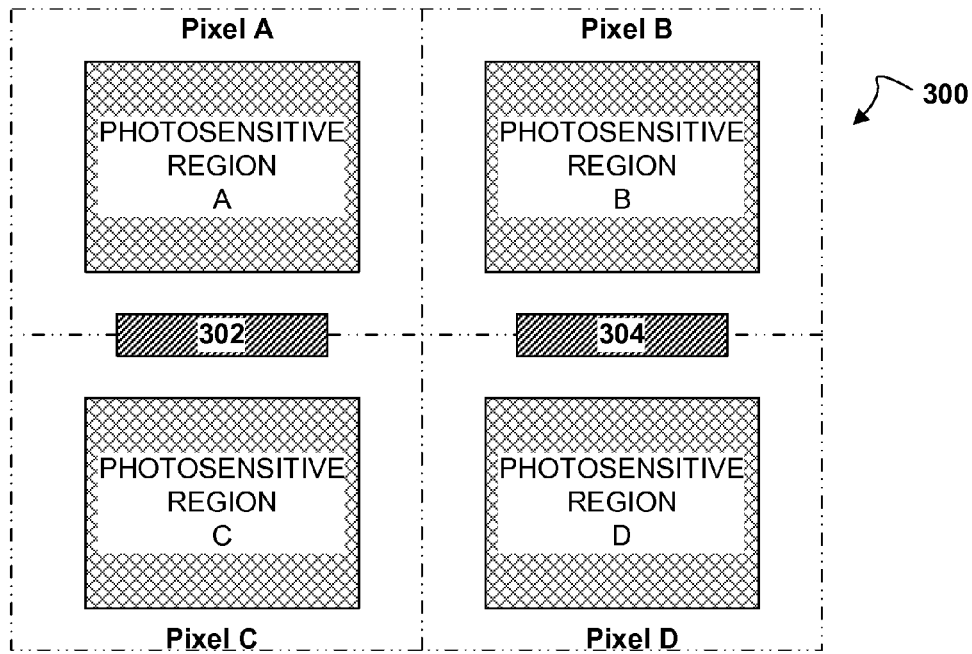
FIG. 3A is a plan view of an embodiment of a group of pixels including overflow drains.

FIG. 3A illustrates an alternative embodiment of an overflow drain configuration. In image sensors with small (e.g., less than 0.11 micron in one embodiment) pixels, there may be insufficient space within the pixels themselves to add an overflow drain to each pixel as shown in FIGS. 2A-2B. In such cases, multiple pixels can share an overflow drain to reduce the amount of space used. In FIG. 3A, four pixels A, B, C and D are formed on a substrate, each pixel having its corresponding photosensitive region. Two overflow drains are also formed on the substrate: overflow drain 302 is formed between the photosensitive regions of pixels A and C, whilst overflow drain 304 is formed between the photosensitive regions of pixels B and D. Hence, in the arrangement shown overflow drain 302 is effectively shared by pixels A and C, while overflow drain 304 is shared by pixels B and D. In other embodiments, the placement of overflow drain 302 relative to the photosensitive areas can be different than shown.

Figure 3B:
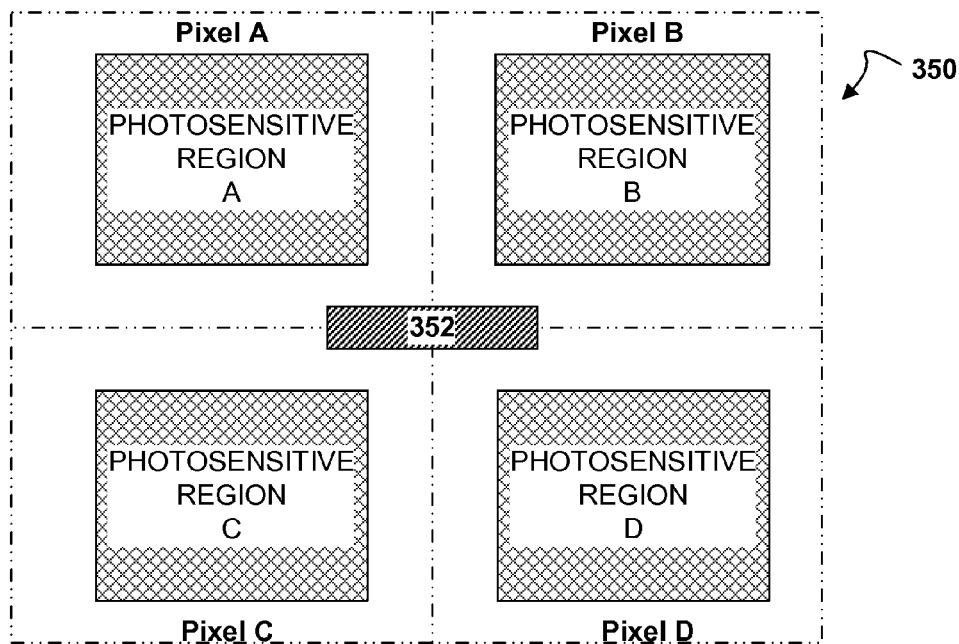
FIG. 3B is a plan view of an alternative embodiment of a group of pixels including an overflow drain.

FIG. 3B illustrates another alternative embodiment of an overflow drain configuration 350. Four pixels A, B, C and D are formed on a substrate, each pixel having its corresponding photosensitive region. One overflow drain 352 is also formed on the substrate, and the overflow drain 352 is substantially equidistant from all four photosensitive regions A-D. Hence, in the illustrated arrangement each overflow drain is effectively shared by four pixels. In other embodiments, the placement of overflow drain 352 relative to photosensitive areas A-D can be different than shown.

Figure 4A:
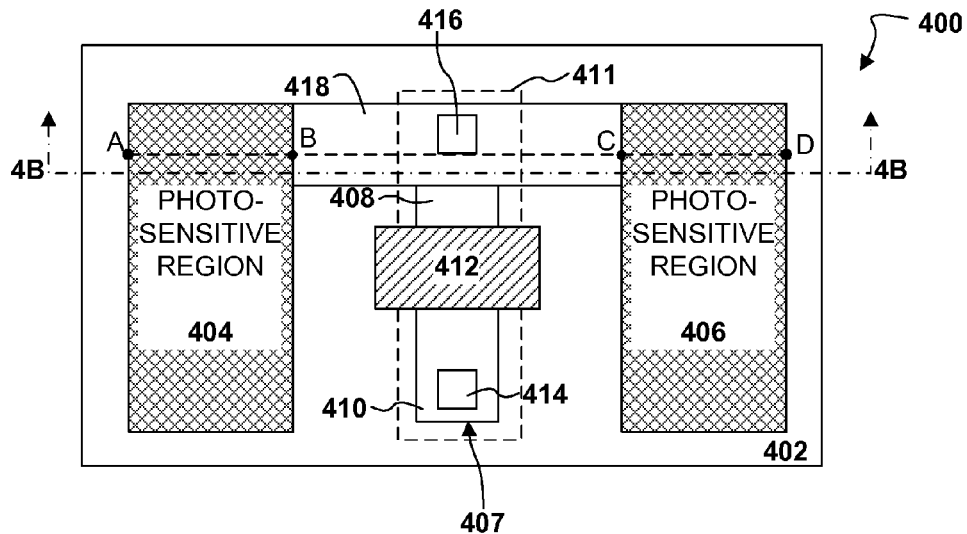
FIG. 4A is a plan view drawing of a portion of an embodiment of an image sensor.
Figure 4B:
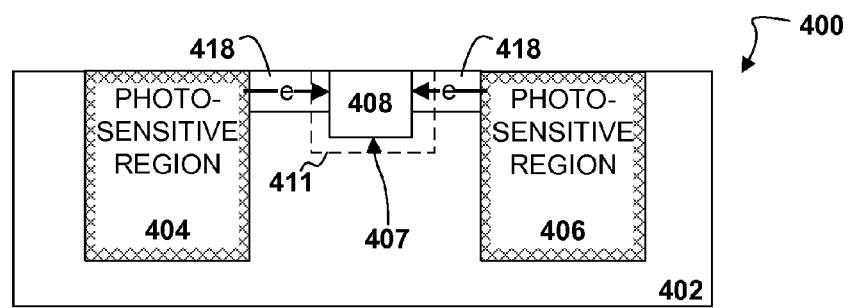
FIG. 4B is a cross-sectional drawing of the embodiment shown in FIG. 4A, taken substantially along section line 4B-4B.

FIGS. 4A-4B illustrate a portion of an alternative embodiment of an image sensor 400 including provisions to reduce or eliminate pixel blooming. For clarity, the drawing omits various elements of each pixel such as transfer gates, floating diffusions and the like. The illustrated portion of image sensor 400 includes a pair of photosensitive regions 404 and 406 formed in, on, or near the front surface of a substrate 402. A source-follower transistor 407 is also formed in, on, or near the front surface. The source follower transistor includes a drain 408, a source 410 and a gate 412 that, when switched on, creates a channel between drain 408 and source 410. Contacts 414 and 416 couple the drain and source to other components, for instance through traces and vias in metal layers formed over the front of the substrate (not shown in this figure, but see FIG. 2B).

A doped bridge 418 is formed on, in or near the front surface of substrate 402 and the bridge couples photosensitive regions 404 and 406 to drain 408 of source-follower transistor 407. This region is void of the shallow trench isolation (STI) which otherwise surrounds transistor 407. In one embodiment the source and drain of source-follower transistor 407 can be partially or wholly surrounded by an n+ doped region 411. In another embodiment only drain 408 can be surrounded by an n+ doped region. In the illustrated embodiment, bridge 418 is a single region extending from photosensitive region 404 to photosensitive region 406, devoid of STI, and coupling both regions to drain 408. Other embodiments can include multiple separate bridges, each separate bridge coupling only one photosensitive region to the drain. Still other embodiments can include a combination of separate bridges joining one photosensitive region to the drain and other bridges joining two or more photosensitive regions to the drain.

Bridge 418 is doped and has an electric potential profile (see FIG. 5) that allows charge carriers (e.g., electrons) to flow from one or both photosensitive regions through bridge 418 to drain 408 when a photosensitive regions become "full," as shown by the arrows labeled "e" in FIG. 4B. In other words, bridge 418 enables drain 408 of source-follower transistor 407 to act as an overflow drain for excess charge carriers from photosensitive regions 404 and 406. Doped bridge 418 couples existing structures and hence takes up no additional space, making it a useful approach in image sensors with little or no pixel space for individual drains (see FIGS. 2A-2B) or shared drains (see FIGS. 3A-3B). The illustrated embodiment shows electrons from both photosensitive regions 404 and 406 simultaneously traveling through the bridge to the drain, but electrons need not flow through the bridge from both photosensitive regions simultaneously. When one photosensitive region becomes full and the other does not, electrons will flow only from the full region to the drain.

Figure 5:
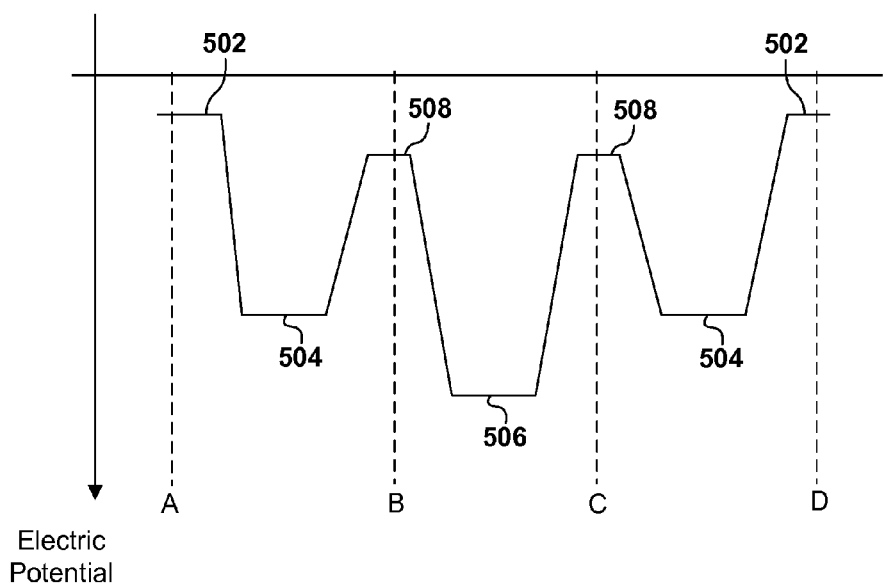
FIG. 5 is a graph illustrating an embodiment of an electric potential profile taken substantially along the line A-B-C-D in FIG. 4B.

FIG. 5 illustrates an embodiment of an electric potential profile for bridge 418 shown in FIG. 4B. In this illustration the positive direction is downward, such that the lowest (least positive) potential is show as the uppermost level and higher potential levels are shown beneath it. Since the source-follower drain voltage is fixed and the distance between photosensitive regions is fixed, the doping concentration between the photosensitive regions and the drain region can be adjusted to tune the performance of bridge 418, hence also tuning the blooming performance of the pixels. In one embodiment bridge 418 is p-doped, but in other embodiments other types of doping can be used.

The electric potential profile of the region extending from point A through points B, C, and D in FIG. 4A is shown in FIG. 5. At points A and D the electric potential 502 is lowest due to in part to those regions being highly doped p-type and generally, but not necessarily, tied to a ground potential. Between points A and B, and again between points C and D, are depicted the photosensitive regions 404 and 406 which are moderately doped n-type. These regions have an intermediate electric potential 504 due to having been mostly depleted of carriers in preparation for the integration period. These regions have an intermediate doping level determined by the designed full well capacity.

The region between points B and C contains in part drain region 408 and optionally region 411. Drain region 408 has a high electric potential 506 due to the combination of being a highly doped n-type region and the application of a full supply voltage level. Carriers are drained from drain 408 into a power supply in normal operation.

The regions beginning at points B and C and continuing to the edges of drain 408 (or optionally region 411) have an electric potential level 508 that is intermediate between the potential 504 of photosensitive areas 404 and 406 and the low potential levels 502 at points A and B. This intermediate potential level 508 is determined in part by the doping level in the region described and in part by the voltage level applied to the drain region. As described earlier, the doping level in this region may be provided in a number of ways. One way is to slightly compensate the highly p-type doping level that normally surrounds the photosensitive regions by adding a low concentration n-type dopant to region 418 only. Another way would be to block in region 418 the process of highly p-type doping the area around the photosensitive regions while admitting it elsewhere.

Figure 6:
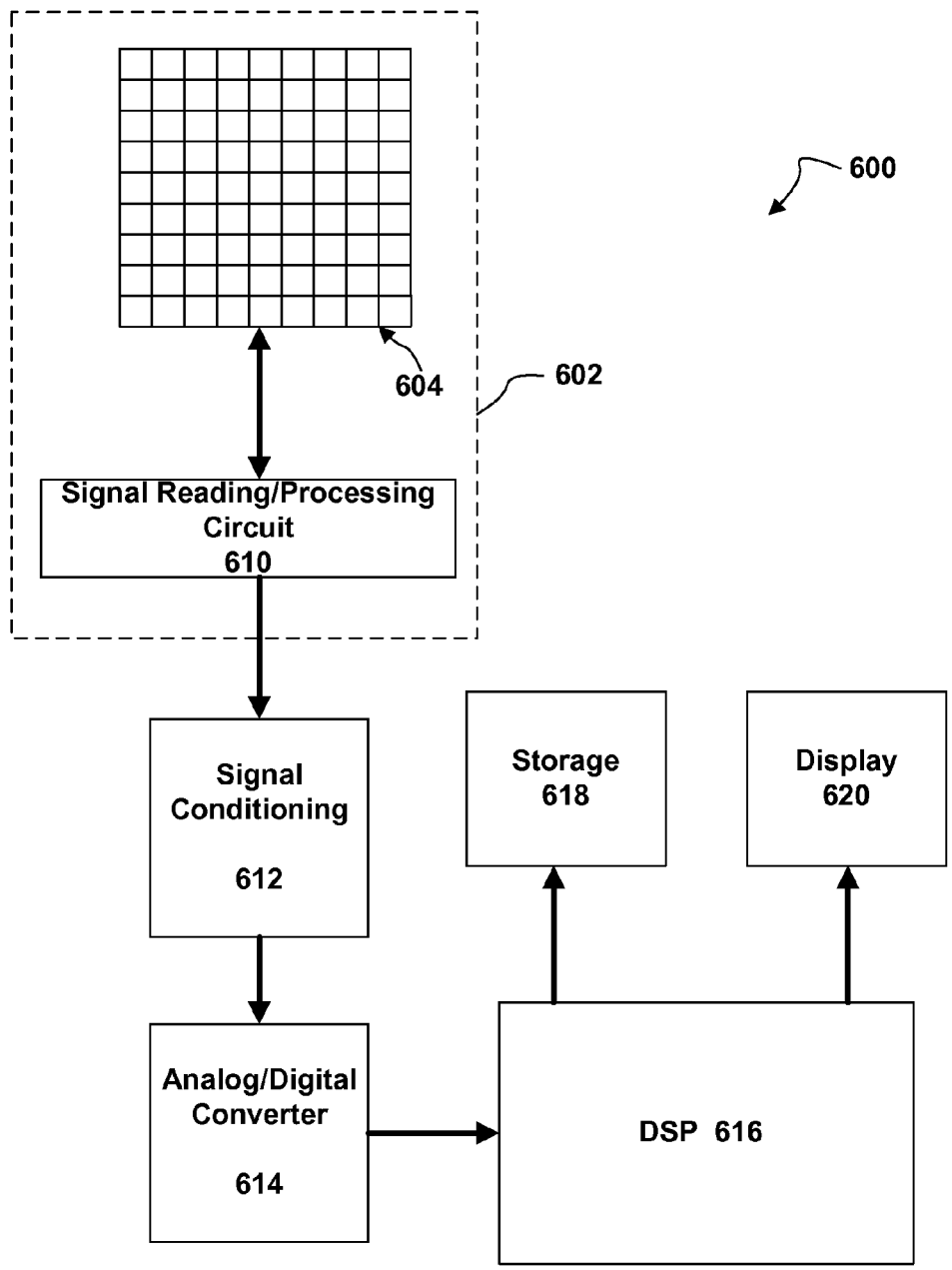
FIG. 6 is a block diagram of an embodiment of an imaging system.

FIG. 6 illustrates an embodiment of an imaging system 600 for processing information or signals from an image sensor. In the illustrated embodiment, image sensor 602 is a backside-illuminated image sensor including a pixel array 604. Pixel array 604 can include one or more pixels with individual overflow drains, as shown in FIGS. 2A-2B, pixels with shared overflow drains as shown in FIGS. 3A-3B, or source-follower overflow drains as shown in FIGS. 4A-4B. Pixel array 604 captures the image and the remainder of system 600 processes the pixel data from the image. During operation of pixel array 604 to capture an image, each pixel in pixel array 604 that captures incident light (i.e., photons) during a certain exposure period converts the collected photons into an electrical charge. The electrical charge generated by each pixel can be read out as an analog signal, and a characteristic of the analog signal such as its charge, voltage or current will be representative of the intensity of light that was incident on the pixel during the exposure period.

Image sensor 602 includes signal reading and processing circuit 610. Among other things, circuit 610 can include circuitry and logic that methodically reads analog signals from each pixel, filters these signals, corrects for defective pixels, and so forth. Circuit 610 can also monitor the blooming performance of the image sensor and adjust the electrical bias of overflow drains in pixel array 604 to optimize the image sensor's blooming performance. In an embodiment where circuit 610 performs only some reading and processing functions, the remainder of the functions can be performed by one or more other components such as signal conditioner 612 or DSP 616. Although shown in the drawing as an element separate from pixel array 604, in some embodiments reading and processing circuit 610 can be integrated with pixel array 604 on the same substrate or can comprise circuitry and logic embedded within the pixel array. In other embodiments, however, reading and processing circuit 610 can be an element external to pixel array 604 as shown in the drawing. In still other embodiments, reading and processing circuit 610 can be an element not only external to pixel array 604, but also external to image sensor 602.

Signal conditioner 612 is coupled to image sensor 602 to receive and condition analog signals from pixel array 604 and reading and processing circuit 610. In different embodiments, signal conditioner 612 can include various components for conditioning analog signals. Examples of components that can be found in the signal conditioner include filters, amplifiers, offset circuits, automatic gain control, etc. In an embodiment where signal conditioner 612 includes only some of these elements and performs only some conditioning functions, the remaining functions can be performed by one or more other components such as circuit 610 or DSP 616. Analog-to-digital converter (ADC) 614 is coupled to signal conditioner 612 to receive conditioned analog signals corresponding to each pixel in pixel array 604 from signal conditioner 612 and convert these analog signals into digital values.

Digital signal processor (DSP) 616 is coupled to analog-to-digital converter 614 to receive digitized pixel data from ADC 614 and process the digital data to produce a final digital image. DSP 616 can include a processor and an internal memory in which it can store and retrieve data. After the image is processed by DSP 616, it can be output to one or both of a storage unit 618 such as a flash memory or an optical or magnetic storage unit and a display unit 620 such as an LCD screen.

The above description of illustrated embodiments of the invention, including what is described in the abstract, is not intended to be exhaustive or to limit the invention to the precise forms described. While specific implementations and examples of the invention are described for illustrative purposes, those skilled in the relevant art will recognize that various equivalent modifications are possible within the scope of the invention. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. A pixel comprising:
    a photosensitive region formed in a surface of a substrate; and
    a floating node formed in the surface of the substrate;
    a transfer gate coupling the photosensitive region to the floating node;
    a source-follower amplification transistor including a drain and a gate, the source-follower gate electrically connected to the floating node; and
    a doped bridge formed in the surface of the substrate to couple, without intermediate connections, the photosensitive region to the drain of the source-follower amplification transistor, wherein the doped bridge is void of the transfer gate or a shallow trench isolation.

2. The pixel of claim 1 wherein the doped bridge is p-doped.

3. The pixel of claim 1 wherein the bridge has a defined doping profile between the photosensitive region and the drain.

4. The pixel of claim 3 wherein the doping profile is such that charge carriers flow from the photosensitive region to the drain when the photosensitive region becomes substantially full of charge carriers.

5. The pixel of claim 3 wherein the doping profile comprises a highly-doped region sandwiched between two more lightly-doped regions.

6. The pixel of claim 1, further comprising:
    a floating diffusion coupled between the photosensitive region and the drain; and
    a transfer transistor coupled between the photosensitive region and the floating diffusion.

* * * * *